Nov. 22, 1966 R. L. REBER 3,287,610

COMPATIBLE PACKAGE AND TRANSISTOR FOR HIGH FREQUENCY OPERATION "COMPACT"

Filed March 30, 1965

2 Sheets-Sheet 1

INVENTOR.
ROBERT L. REBER

BY James M. Nickels

ATTORNEY

Nov. 22, 1966 R. L. REBER 3,287,610

COMPATIBLE PACKAGE AND TRANSISTOR FOR HIGH FREQUENCY OPERATION "COMPACT"

Filed March 30, 1965 2 Sheets-Sheet 2

INVENTOR.
ROBERT L. REBER
BY James M. Nickels
ATTORNEY

United States Patent Office 3,287,610

Patented Nov. 22, 1966

3,287,610

COMPATIBLE PACKAGE AND TRANSISTOR FOR HIGH FREQUENCY OPERATION "COMPACT"

Robert L. Reber, Eatontown, N.J., assignor to The Bendix Corporation, Eatontown, N.J., a corporation of Delaware Filed Mar. 30, 1965, Ser. No. 443,892

1 Claim. (Cl. 317—234)

The present invention relates to semiconductor devices and more particularly to semiconductor devices adapted for operation at high frequencies.

In designing semiconductor devices for operation at high frequencies, difficulties are encountered in arriving at an optimum design. In designs adaptable for high frequency the power capability would be limited to an extremely low value. If designed for higher power, the device would not be suitable for high frequencies due to capacitive effects and also to the lack of sufficient heat dissipation.

The present invention provides a device of a concentric circle design which provides maximum emitter periphery to emitter area ratio and radial connections in which capacitive effects are minimized and provide maximum power dissipation and heat distribution.

It is an object of the invention to provide an improved semiconductor device.

Another object of the invention is to provide a semiconductor device adapted for operation at high frequencies.

Another object of the invention is to provide a semiconductor device having a coaxial geometry.

Another object of the invention is to provide a transistor having a novel geometry.

Another object of the invention is to provide a transistor having high power distribution.

Another object of the invention is to provide a transistor having novel contact means.

The above and other objects and features of the invention will appear more fully hereinafter from a consideration of the following description taken in connection with the accompanying drawing wherein one embodiment is illustrated by way of example.

Figure 1:
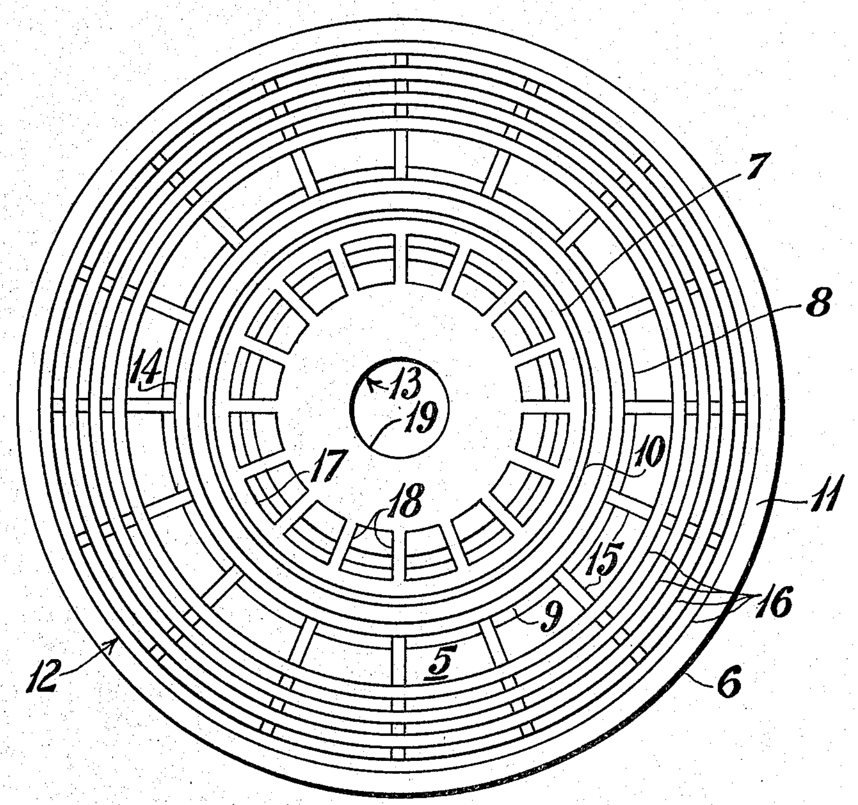
FIGURE 1 is a plane view of a device embodying the invention.
Figure 2:
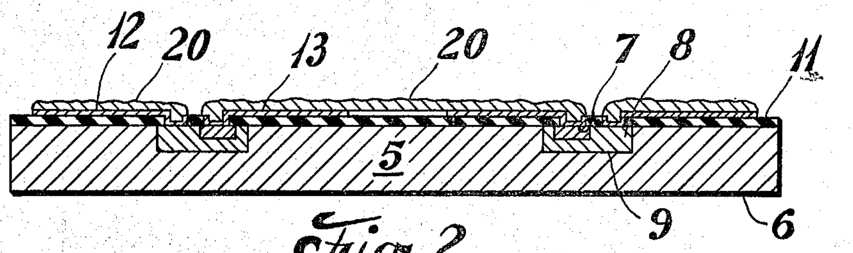
FIGURE 2 is a sectional view of a device embodying the invention.

Reference is now made to the drawings wherein the same reference numerals have been assigned similar parts in the various figures. In FIGURES 1 and 2 a semiconductor device is indicated generally by the numeral 5 and for purposes of illustration may be an NPN silicon transistor of the planar type. It is understood, however, that other kinds and types could be utilized. The device 5 includes a collector 6, an emitter 7 and a base 8.

The collector 7 is a circular wafer of semiconductor material and for purposes of illustration may be of NN+ silicon. The base 8 has a ring-like configuration and is of the opposite type conductivity, in this example P type silicon, and forms a rectifying junction 9 with the collector 6. The emitter 7 is also of a ring-like or circular configuration and is of an opposite type conductivity from the base 8, in this example N type silicon and forms a rectifying function 10 with the base 8. By masking, the base 8 and emitter 7 are positioned to be concentric with the collector 6 and with each other.

A layer of silicon oxide ($SiO_2$) 11 is formed on the surface of the device 5. By masking, the oxide 11 is removed from a circle on the base 8 and emitter 7. A metal such as chrome-nickel is evaporated onto the oxide layer in a predetermined pattern to form base contact 12 and emitter contact 13. The base contact 12 includes a ring 14 in contact with the base 8. The ring 14 is connected by a plurality of radially extending spokes 15 to a plurality of concentric rings 16 which together form the base contact 12. The emitter contact 13 includes a ring 17 of the metal, such as chrome-nickel, in contact with the emitter 7. The ring 17 is connected by a plurality of radially extending spokes 18 to a ring 19 together which form the emitter contact 13.

Next a coating of solder 20 is applied to the base contact 12 and emitter contact 13. Wetting of the solder to the metal presents no problem. It might, however, be necessary to mask by photoresist or other suitable methods to prevent the solder from wetting unwanted areas.

Figure 3:
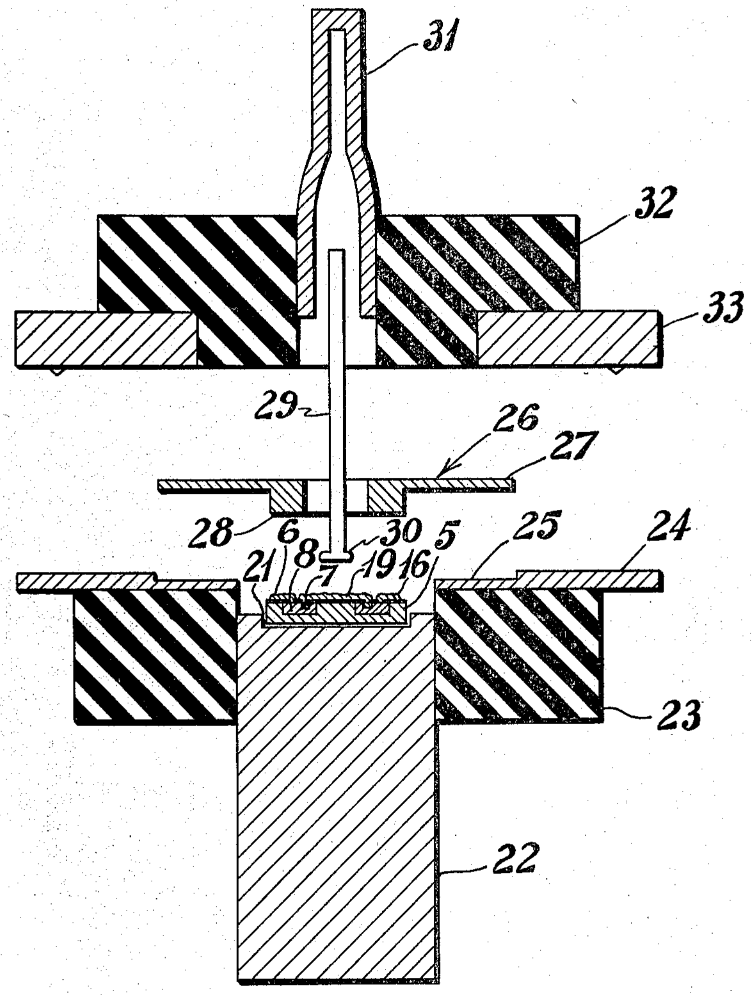
FIGURE 3 is an exploded sectional view of a device embodying the invention.

Reference is now made to FIGURE 3 for the assembly of the device 5 into a complete package. The device 5 is mounted in a recess 21 in a stud 22 by soldering or eutectic mounted to make good contact therewith. The stud 22 is secured in a ring 23 of an insulating material, such, for example, as a ceramic. The stud 22 may be of copper or other suitable material. A washer 24 of a conducting material, for example, nickel plated copper, is secured to the ring 23 and has a recessed portion 25 on the inner diameter thereof. A washer 26 of a solderable material, such, for example as silver, has a flanged section 27 adapted to fit in the recessed section 25 of the copper washer 24. Also the washer 26 has an axially extending section 28 of a size and circular configuration to register with the rings 16 of the base contact 12. The flange 27 of the washer 26 is secured to the ring 24 by soldering. Also the section 28 is secured to the rings 16 of the base contact 12 by soldering.

A pin 29 of a conducting material, for example, silver, has a head section 30 proportional to register with the ring 19 of the emitter contact 13. The head 30 of the pin 29 is secured to the ring 19 by soldering. The pin 29 is proportioned to fit into and attach to a tubulation 31 of a conductive material, for example, a nickel tube, which may be crimped and soldered to the pin 29 to form a good electrical contact therewith. The tubulation 31 is mounted in a ring 32 of insulating material, for example, a ceramin. Embedded in the ring 32 is a ring 33 of a conducting material, for example, nickel plated copper. The ring 33 is proportioned to register with the ring 24 and is secured thereto by welding to form a unitary structure.

Use of the concentric circle design results in maximum emitter periphery to emitter area ratio and allows contact to all parts of both the emitter and base. The radial base connection is ideal for VHF operation. The circle construction provides maximum power dissipation and heat distribution. Further the grid base contact achieves minimum base contact area to minimize capacitive effects.

Although only one embodiment of the invention has been illustrated and described, various changes in the form and relative arrangement of the parts, which will now appear to those skilled in the art, may be made without departing from the scope of the invention.

What is claimed is:

A semiconductor device and housing comprising a disc of semiconductor material having a ring-shaped base region and a ring-shaped emitter region diffused therein, said emitter overlying said base and concentric therewith, contact rings on said base and said emitter, a plurality of inwardly extending radial arms connected to said emitter contact ring, a plurality of outwardly extending radial arms connected to said base contact ring, oxide insulating means insulating said radial arms from said semiconductor material, a plurality of concentric rings of conducting material connected to said outwardly extending radial arms, a plurality of concentric rings of conducting material connected to said inwardly extending radial arms, said housing having a mounting block for mounting said disc of semiconductor material, a ring of insulating material surrounding said block, a washer of conducting material secured to said insulating ring contacting said plurality of rings connected to said outwardly extending radial arms, a second ring of insulating material, a second conducting washer secured thereto and to said first washer to provide a unitary structure, a tubulation secured to said second ring of insulating material, and a pin of conducting material extending through and secured to said tubulation and having a head thereon contacting said innermost concentric ring.

References Cited by the Examiner

UNITED STATES PATENTS

| | | | |
|---|---|---|---|
| 2,924,760 | 2/1960 | Herlet | 317—235 |
| 3,191,070 | 6/1965 | Jones et al. | 317—235 |
| 3,212,162 | 10/1965 | Moore | 317—235 |
| 3,214,652 | 10/1965 | Knowles | 317—235 |

FOREIGN PATENTS

| | | |
|---|---|---|
| 379,001 | 8/1964 | Switzerland. |

OTHER REFERENCES

Bell Lab. Record, "Microwave Transistor Mounts in Coaxial Shell" April 1960, vol. 38, No. 4, page 141.

JOHN W. HUCKERT, *Primary Examiner.*

J. D. CRAIG, *Assistant Examiner.*